US012604539B2

(12) United States Patent
Iwamoto et al.

(10) Patent No.:    US 12,604,539 B2
(45) Date of Patent:      Apr. 14, 2026

(54) SOLAR CELL MODULE AND METHOD FOR MANUFACTURING SOLAR CELL MODULE

(71) Applicant: TOYOTA JIDOSHA KABUSHIKI KAISHA, Toyota (JP)

(72) Inventors: Shoichi Iwamoto, Fuji (JP); Taizo Masuda, Yokohama (JP); Yuya Okuda, Nisshin (JP); Ryota Morikawa, Osaka (JP); Shinya Iwasaki, Mizuho (JP); Shintaro Hinata, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 19/038,714

(22) Filed: Jan. 28, 2025

(65)             Prior Publication Data

US 2025/0318280 A1      Oct. 9, 2025

(30)        Foreign Application Priority Data

Apr. 5, 2024    (JP) ................................. 2024-061182

(51) Int. Cl.
 *H10F 19/80*          (2025.01)
 *H02S 20/30*          (2014.01)
(52) U.S. Cl.
 CPC ............. *H10F 19/80* (2025.01); *H02S 20/30* (2014.12)
(58) Field of Classification Search
 CPC .......... H10F 19/00; H10F 19/30; H10F 19/80; H02S 20/30
 See application file for complete search history.

(56)            References Cited

U.S. PATENT DOCUMENTS

2014/0167677 A1 *  6/2014  Voelkner ................... H02J 7/35
                                                   438/66
2014/0251415 A1 *  9/2014  Inaba ...................... H10F 19/80
                                                   438/66

FOREIGN PATENT DOCUMENTS

JP         2016-122755 A      7/2016
JP         2019102620 A   *  6/2019
WO    WO-2019087918 A1 *  5/2019   ............. H10F 19/80

OTHER PUBLICATIONS

Machine translation of JP-2019102620-A, Sano Hirotaka. (Year: 2019).*
Machine translation of WO-2019087918-A1, Sano Hirotaka. (Year: 2019).*

* cited by examiner

*Primary Examiner* — Mayla Gonzalez Ramos
(74) *Attorney, Agent, or Firm* — SoraIP, Inc.

(57)            ABSTRACT

A curved plate-shaped solar cell module includes a front surface layer, a back surface layer, first and second solar cell units, and a sealing material, wherein the first solar cell unit includes a plurality of strip-shaped first cells, each first cell includes a flexible, strip-shaped film base material and a perovskite element, and is curved according to a curved shape of the solar cell module, and a reinforcing portion having a higher bending rigidity than other portions of the film base material is formed at an edge portion along the longitudinal direction of the film base material.

5 Claims, 5 Drawing Sheets

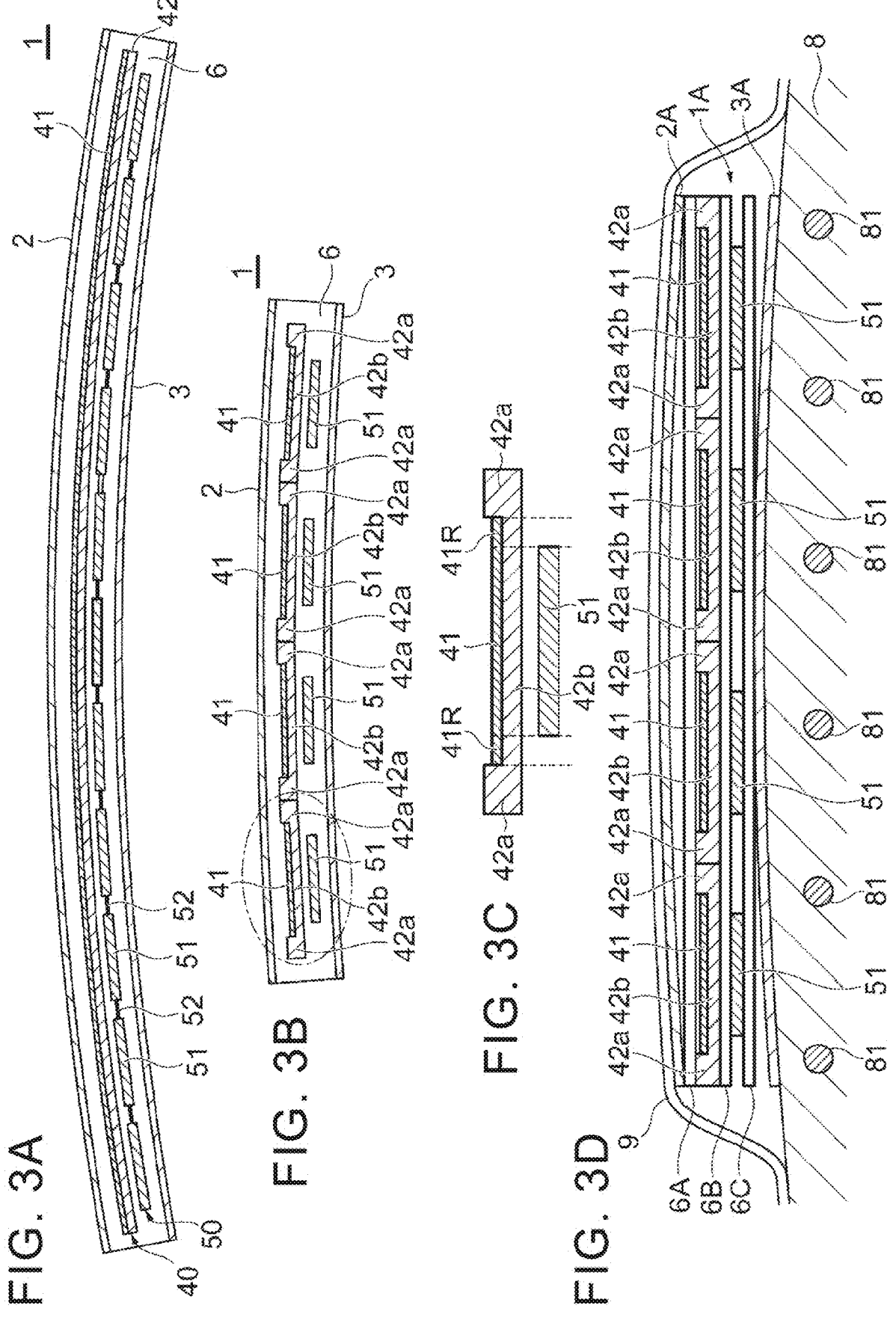

SOLAR CELL MODULE AND METHOD FOR MANUFACTURING SOLAR CELL MODULE

CROSS-REFERENCE TO RELATED APPLICATION

This application claims priority to Japanese Patent Application No. 2024-061182 filed on Apr. 5, 2024, incorporated herein by reference in its entirety.

BACKGROUND

1. Technical Field

The present disclosure relates to solar cell modules and methods for manufacturing a solar cell module.

2. Description of Related Art

For example, Japanese Unexamined Patent Application Publication No. 2019-102620 (JP 2019-102620 A) discloses a tandem solar cell module as this type of technique. This solar cell module includes a light-transmitting first protective member and a second protective member. A first solar cell unit and a second solar cell unit are arranged in this order from the first protective member side in a clearance region between the first and second protective members. The first solar cell unit includes a plurality of strip-shaped first solar cell elements. The first solar cell elements are arranged next to each other in the lateral direction of the first solar cell element on the first protective member.

SUMMARY

When the solar cell module has a curved shape, it is difficult to coat the surface of the curved first protective member with the first solar cell elements (so-called power generation elements) described in JP 2019-102620 A. One possible solution to this is to arrange cells, namely strip-shaped film base materials each having the power generation element disposed thereon, next to each other in the lateral direction of the cell and bend the arranged film base materials according to the curved shape of the solar cell module.

However, the solar cell module may not have a uniform temperature distribution when, for example, the solar cell module is irradiated with sunlight. In this case, the film base material is subjected to a local stress due to the difference in elongation in the longitudinal direction of the film base material caused by the temperature change, and as a result, fine wrinkles may be formed in the film base material. Such a phenomenon is more likely to occur particularly when the film base material is curved, which may deteriorate the performance of the solar cell module.

The present disclosure was made in view of the above circumstances, and an object of the present disclosure is to provide a solar cell module and a method for manufacturing a solar cell module that can reduce formation of fine wrinkles in a curved film base material of the solar cell module in the form of a curved plate.

In view of the above issue, the solar cell module according to the present disclosure is a solar cell module in a form of a curved plate. The solar cell module includes:

a light-transmitting front surface layer;

a back surface layer; a first solar cell unit and a second solar cell unit that are arranged in an order of the first solar cell unit and the second solar cell unit from a front surface layer side between the front surface layer and the back surface layer; and a sealing material that seals the first solar cell unit and the second solar cell unit.

The first solar cell unit includes a plurality of strip-shaped first cells.

The first cells are arranged next to each other in a lateral direction of the first cell.

Each of the first cells includes a flexible, strip-shaped film base material and a first power generation element. The first power generation element is disposed along a longitudinal direction of the film base material on one surface of the film base material. The first cells are curved according to a curved shape of the solar cell module.

The second solar cell unit includes a plurality of second power generation elements arranged in the longitudinal direction of the film base material so as to face the other surface of each of the film base materials along a longitudinal direction of the first cell.

A reinforcing portion is provided at an edge portion of the film base material. The edge portion is a portion along the longitudinal direction of the film base material, and the reinforcing portion has a higher bending rigidity than a remaining portion of the film base material.

In view of the above issue, the method for manufacturing a solar cell module according to the present disclosure is a method for manufacturing a solar cell module in a form of a curved plate.

The solar cell module includes a first solar cell unit and a second solar cell unit.

The first solar cell unit includes a plurality of strip-shaped first cells.

Each of the first cells includes a flexible, strip-shaped film base material and a first power generation element. The first power generation element is disposed along a longitudinal direction of the film base material on one surface of the film base material.

The second solar cell unit includes a plurality of second power generation elements.

The method includes:

fabricating a stack in which the first solar cell unit and the second solar cell unit are arranged between a light-transmitting curved front panel and a curved back panel so as to sandwich a sealing sheet between the front panel and the back panel, the first solar cell unit and the second solar cell unit being arranged in an order of the first solar cell unit and the second solar cell unit from the front panel side, and the sealing sheet being made of a resin; and pressing the stack by hot press at a heating temperature equal to or higher than a softening point of the resin until the first solar cell unit and the second solar cell unit are sealed with the resin of the sealing sheet.

In the fabricating, the first cells, each having a reinforcing portion formed at an edge portion of the film base material, are arranged next to each other in a lateral direction of the first cell, the edge portion being a portion along the longitudinal direction of the film base material, and the reinforcing portion having a higher bending rigidity than a remaining portion of the film base material, and the second power generation elements are arranged in the longitudinal direction of the film base material so as to face the other surface of each of the film base materials along a longitudinal direction of the first cell.

The present disclosure can reduce formation of fine wrinkles in a curved film base material of a solar cell module in the form of a curved plate.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 3A is a sectional view taken along line IIIA-IIIA in FIG. 1;

FIG. 3B is a sectional view taken along line IIIB-IIIB in FIG. 1;

FIG. 3C is an enlarged view of a part surrounded by a dashed-dotted line in FIG. 3B;

FIG. 3D is an illustration schematically showing a method for manufacturing a solar cell module according to an embodiment;

DETAILED DESCRIPTION OF EMBODIMENTS

Embodiment

Figure 1:
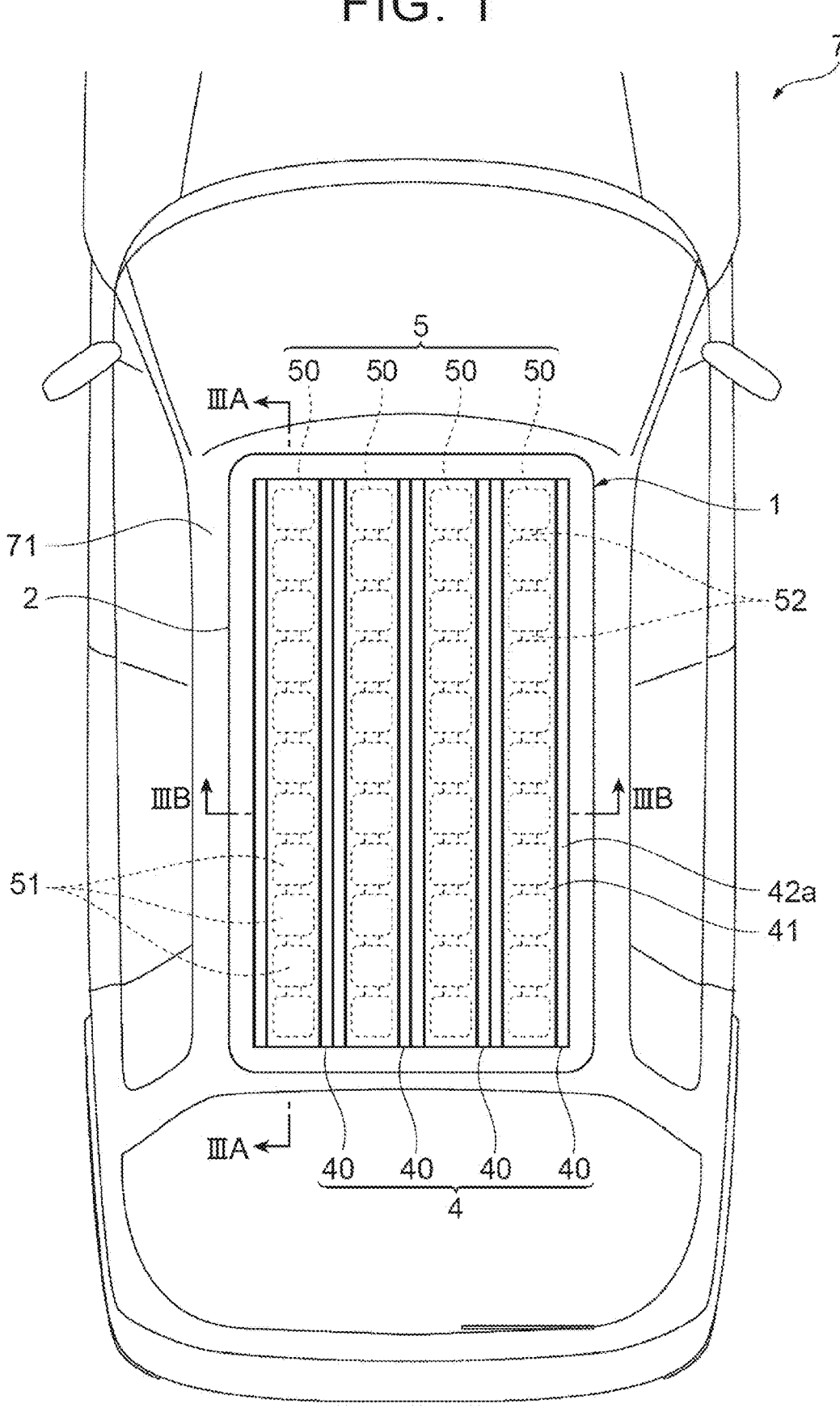
FIG. 1 is a plan view schematically showing a state in which a solar cell module according to the present embodiment is mounted on an existing roof base material in a vehicle.

Embodiments of the present disclosure will be described below referring to the drawings of FIGS. 1 to 5B. It should be noted that the embodiment described below is an aspect of the present disclosure, and is not intended to limit the technical scope of the present disclosure.

<Configuration>

FIG. 1 is a plan view schematically showing a state in which a solar cell module 1 according to the present embodiment is mounted on an existing roof base material in a vehicle 7. The roof 71 of the vehicle 7 is constituted by mounting the solar cell module 1 according to the present embodiment on a roof base material. The solar cell module 1 has a curved plate shape. Therefore, it can be mounted on the roof base material according to the shape of the roof base material of the vehicle 7 which is curved in the same manner. In the example shown in FIG. 1, the curvature of the roof base material is larger in the vehicle length direction (the up-down direction in the direction of FIG. 1) than in the vehicle width direction (the left-right direction in the direction of FIG. 1) of the vehicle 7. In accordance with this, the solar cell module 1 formed so that the roof 71 has a shape having a larger curvature with respect to the vehicle length direction is mounted on the roof base material.

The solar cell module 1 has a tandem structure, and has a front surface layer 2 made of glass having a light-transmitting property on the uppermost layer (that is, the layer closest to the direction in FIG. 1) of the roof 71. When the solar cell module 1 is irradiated with light such as sunlight, the irradiated light passes through the front surface layer 2 and reaches the inside of the solar cell module 1. As a result, electromotive force is generated between the positive electrode and the negative electrode of the solar cell module 1, and the generated electric power can be supplied to the vehicle 7.

The solar cell module 1 is thin and lightweight. Taking advantage of this characteristic, the solar cell module 1 can be mounted on various types in addition to the roof base material of the vehicle 7 illustrated in FIG. 1.

Figure 2:
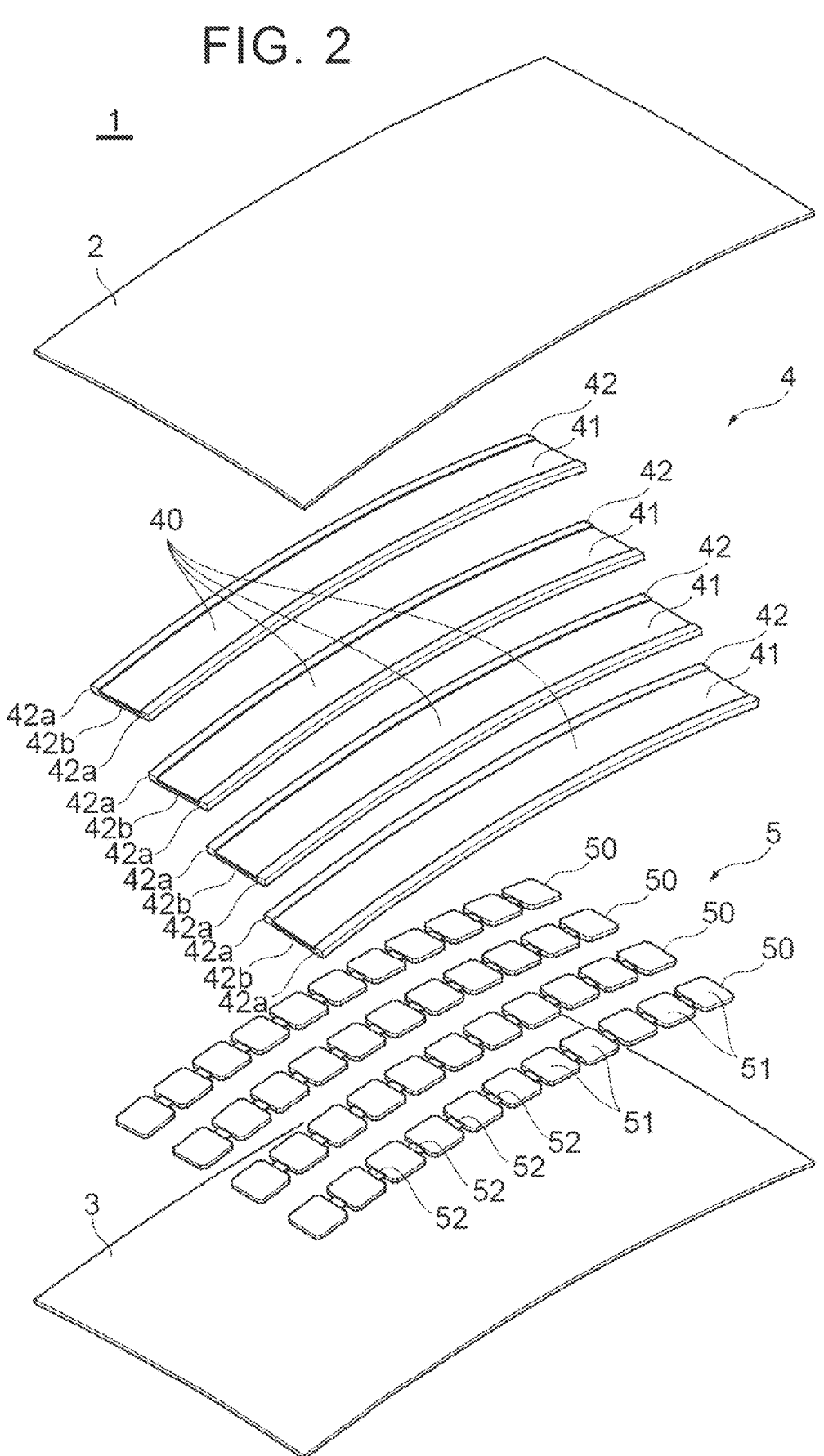
FIG. 2 is an exploded perspective view of the solar cell module according to the present embodiment.

FIG. 2 is an exploded perspective view of the solar cell module 1 according to the present embodiment. FIG. 3A is a sectional view taken along line IIIA-IIIA in FIG. 1, that is, a sectional view taken along the longitudinal direction of the solar cell module 1. FIG. 3B is a sectional view taken along line IIIB-IIIIB in FIG. 1, that is, a sectional view taken along the longitudinal direction of the solar cell module 1. The solar cell module 1 includes a front surface layer 2, a back surface layer 3, first and second solar cell units 4 and 5, a sealing material 6 (not shown in FIG. 2), and the like. The first and second solar cell units 4 and 5 are arranged between the front surface layer 2 and the back surface layer 3 in order from the front surface layer 2 side. The sealing material 6 encapsulates the first and second solar cell units 4, 5. The back surface layer 3 is also made of glass in the same manner as the front surface layer 2.

The first solar cell unit 4 has a plurality of (e.g., four) strip-shaped first cells 40, and the plurality of first cells 40 are arranged next to each other in the lateral direction of the first cell 40. Each of the first cells 40 includes a flexible, strip-shaped film base material 42 and a perovskite element 41 disposed along the longitudinal direction of the film base material 42 on one surface thereof, and is curved according to the curved shape of the solar cell module 1. The perovskite element 41 is a power generation element using perovskite as a raw material, and has flexibility similar to that of the film base material 42. The film base material 42 is made of a resin material having a light-transmitting property, and is mainly made of an insulating thermoplastic resin such as PET (polyethylene terephthalate) resin. The second solar cell unit 5 includes a plurality of silicon crystal elements 51 arranged along the longitudinal direction of the first cell 40 so as to face the other surface of each film base material 42. Here, the perovskite element 41 corresponds to the first power generation element of the present disclosure, and the silicon crystal element 51 is also a kind of power generation element, and corresponds to the second power generation element of the present disclosure. The silicon crystal element 51 may be single crystal or polycrystalline.

As described above, the irradiation light passes through the front surface layer 2 and then reaches the inside of the solar cell module 1. When the irradiation light reaches the perovskite element 41 first, the irradiation light is absorbed by the perovskite element 41 or transmitted through the perovskite element 41 and absorbed by the silicon crystal element 51 according to the wavelength range of the irradiation light. Specifically, light having a wavelength range shorter than a predetermined value, such as visible light, is absorbed by the perovskite element 41, and light having a wavelength range longer than a predetermined value, such as infrared light, is transmitted through the perovskite element 41 and absorbed by the silicon crystal element 51. That is, by stacking power generation elements having different lengths of wavelengths to be absorbed, it is possible to absorb light having wavelengths in a wide spectral range, and it is possible to convert energy of irradiation light into electrical energy with high conversion efficiency. Each of the silicon crystal elements 51 is connected by a connector 52, and a current flows through the entire second solar cell unit 5 via the connector 52.

As described above, the solar cell module 1 is curved in accordance with the curved shape of the roof base material of the vehicle 7, and the curvature of the roof base material is larger in the vehicle length direction than in the vehicle width direction of the vehicle 7. Here, the curvature refers to the reciprocal of the radius (radius of curvature) of a locally curved portion (in the above example, the curved portion of the roof substrate) when approximated as a part of a circle. The solar cell module 1 is curved along the first direction, and is more curved along the second direction perpendicular to the first direction than along the first direction. When the solar cell module 1 is mounted on the roof base material of the vehicle 7, the first direction having a relatively small curvature is mounted so as to match the vehicle width method, and the second direction having a relatively large curvature is mounted so as to match the vehicle length direction.

As shown in FIGS. 3A and 3B, the film base material 42 is curved along its longitudinal direction according to the curvature in the second direction of the solar cell module 1. In addition, the first cell 40 is arranged such that the longitudinal direction of the film base material 42 coincides with the second direction. However, the film base material 42 being curved along its longitudinal direction may cause the following problems. For example, when sunlight is applied to the solar cell module 1, the temperature distribution of the solar cell module 1 may not be uniform. As a result, a local stress is generated in the film base material 42 due to the difference in elongation in the longitudinal direction of the film base material 42 caused by the temperature change, and as a result, fine wrinkles may be generated in the film base material 42. In particular, since the film base material 42 is curved, such a phenomenon is more likely to occur, and the performance of the solar cell module 1 may be deteriorated.

Therefore, in the present embodiment, a reinforcing portion 42a having a higher bending rigidity than the other portions of the film base material 42 is formed at the edge portion along the longitudinal direction of the film base material 42. Here, the bending rigidity is an index indicating the difficulty of bending deformation of the member, and is a value obtained by dividing the bending moment by the curvature. Further, the other part is a non-reinforcing portion 42b, and the perovskite element 41 is formed so as to cover the non-reinforcing portion 42b. It should be noted that the reinforcing portion 42a has a higher bending rigidity as compared with the non-reinforcing portion 42b, and the height of the bending rigidity can be evaluated by a method normally performed by a person skilled in the art, and therefore, detailed explanation thereof will be omitted.

Since the reinforcing portion 42a is formed at the edge portion along the longitudinal direction of the film base material 42, deformation of the film base material 42 caused by the difference in elongation in the longitudinal direction of the film base material 42 can be suppressed. As a result, it is possible to suppress generation of fine wrinkles in the film base material 42, and thus it is possible to suppress deterioration in performance of the solar cell module 1. Furthermore, the first cell 40 is arranged such that the longitudinal direction of the film base material 42 coincides with the second direction. Therefore, it is possible to effectively suppress generation of fine wrinkles in the film base material 42 by the reinforcing portion 42a formed along the longitudinal direction of the film base material 42.

Note that the thickness of the reinforcing portion 42a is larger than the thickness of the non-reinforcing portion 42b when the resin of the reinforcing portion 42a and the resin constituting the non-reinforcing portion 42b are the same resin. Specifically, the reinforcing portion 42a may be formed by bonding the same resin as the resin constituting the non-reinforcing portion 42b to the edge portion along the longitudinal direction of the film base material 42, or may be formed by folding back the edge portion of the film base material 42 as the reinforcing portion 42a. In addition, the reinforcing portion 42a may be made of a material such as aluminum, titanium, or stainless steel, for example, when the reinforcing portion 42a and the non-reinforcing portion 42b are made of different types of resins. In this way, the Young's modulus of the material constituting the reinforcing portion 42a can be made higher than the Young's modulus of the material constituting the non-reinforcing portion 42b. Further, the reinforcing portion 42a may be formed also at an edge portion of the film base material 42 along the lateral direction.

Incidentally, since the reinforcing portion 42a is made of resin or metal, when the solar cell module 1 is irradiated with the irradiation light, the irradiation light may not be transmitted through or hardly transmitted through the reinforcing portion 42a. In this case, since the reinforcing portion 42a is irradiated with the irradiation light obliquely, there is a possibility that the shadowed portion caused by the reinforcing portion 42a is reflected in the silicon crystal element 51. As a result, hot spots may occur, and the power generation performance of the solar cell module 1 may deteriorate over a long period of time. Here, in FIG. 3C, an enlarged view of a part surrounded by a dashed-dotted line in FIG. 3B is shown. As shown in FIG. 3C, the length of the perovskite element 41 is longer than the length of the silicon crystal element 51 in the lateral direction of the film base material 42. The silicon crystal element 51 is disposed with respect to the perovskite element 41 in the lateral direction so as to leave the power generation region 41R of the perovskite element 41 on both sides in the lateral direction, when the solar cell module 1 is viewed in the thickness direction.

Due to the relative arrangement of the silicon crystal element 51 with respect to the perovskite element 41 shown in FIG. 3C, even when the reinforcing portion 42a is irradiated with the irradiation light from an oblique direction, it is difficult for the shadowed part due to the reinforcing portion 42a to be reflected in the silicon crystal element 51. As a result, it is possible to suppress the occurrence of hot spots of the silicon crystal element 51 caused by the shadow portion appearing in the silicon crystal element 51.

FIG. 3D is an illustration schematically showing a method for manufacturing a solar cell module 1 according to an embodiment of the present disclosure. The method for manufacturing a curved plate-shaped solar cell module 1 will be described with reference to FIG. 3D. The manufacturing method includes a fabricating step and a hot press step. Specifically, in the fabricating step, a stack 1A is fabricated in which the first and second solar cell units 4, 5 are arranged between a light-transmitting curved front panel 2A and a curved back panel 3A so as to sandwich resin sealing sheets 6A to 6C between the front panel 2A and the back panel 3A. The first and second solar cell units 4, 5 are arranged in this order from the front panel 2A side, and the sealing sheets 6A to 6C are made of a resin. At this time, the first cells 40 in which the reinforcing portions 42a are formed at the edge portions along the longitudinal direction of the film base material 42 are arranged next to each other in the lateral direction. The silicon crystal elements 51 are arranged along the longitudinal direction of the film base material 42 so as to face the other surface of each film base material 42 along the longitudinal direction of the film base material 42.

In the hot press step, a laminator is used to press the stack 1A fabricated in the fabricating step by hot press at a heating temperature equal to or higher than the softening point of the resin until the first and second solar cell units 4 and 5 are sealed with the resin of the sealing sheets 6A to 6C. Specifically, the stack 1A is disposed on a laminating jig (not shown), and the laminating jig is placed on the heater plate 8 of the laminator, sealed in a chamber (not shown), and then sufficiently degassed so that air or the like is not mixed. After being sufficiently degassed, the resin of the sealing sheet 6A-6C is heated and softened by the heater 81 built in the heater plate 8 at a temperature equal to or higher than the softening point of the resin. At this time, by opening the inside of the laminator to the atmospheric pressure, the stack 1A is pressed by the diaphragm 9 from above at atmospheric pressure (100 kPa). After that, the softened resin of the sealing sheets 6A to 6C is crosslinked and adhered, and the first and second solar cell units 4 and 5 are sealed, thereby completing the hot press step.

In the above manufacturing process, the front panel 2A, the back panel 3A, and the sealing sheet 6A-6C correspond to the front surface layer 2, the back surface layer 3, and the sealing material 6 of the completed solar cell module 1, respectively. In the completed solar cell module 1, as described above, the first solar cell unit 4 includes a plurality of strip-shaped first cells 40. Each of the first cells 40 includes a flexible, strip-shaped film base material 42 and a perovskite element 41 disposed along the longitudinal direction thereof on one surface thereof. The second solar cell unit 5 includes a plurality of silicon crystal elements 51, and a reinforcing portion 42a having higher bending rigidity than the non-reinforcing portion 42b is formed at an edge portion along the longitudinal direction of the film base material 42. Therefore, in the hot press step, the first cells 40 of the first solar cell unit 4 disposed between the front panel 2A and the back panel 3A are curved in accordance with the curved shapes of the front panel 2A and the back panel 3A. At this time, the generation of wrinkles in the first cell 40 caused by thermal shrinkage of the film base material 42 is suppressed by the reinforcing portion 42a along the edge portion of the film base material 42. As a result, degradation of the performance of the solar cell module 1 can be suppressed.

Figures 4A, 4B:
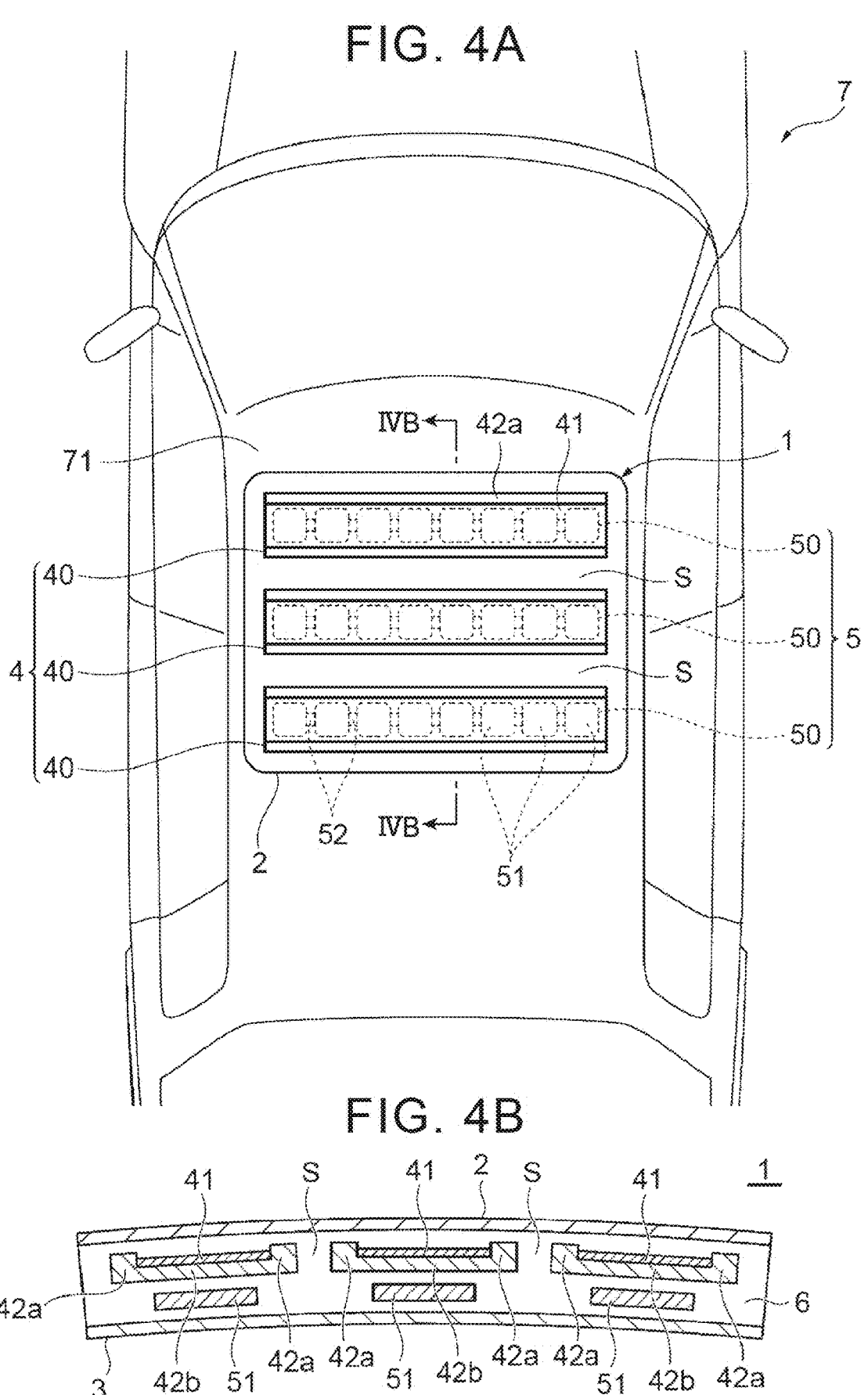
FIG. 4A is a plan view schematically showing a solar cell module according to a modification mounted as part of a roof of a vehicle.
FIG. 4B is a sectional view taken along line IVB-IVB in FIG. 4A.

For example, a modification of the solar cell module 1 shown in FIG. 1 will be described. In FIG. 4A, the solar cell module 1 according to the modification is schematically shown mounted as a part of the roof 71 of the vehicle 7. FIG. 4B is a sectional view taken along line IVA-IVA in FIG. 4A. Since the solar cell module 1 only needs to be mounted on the vehicle 7 as at least a part of the roof 71, as a difference from FIG. 1, the solar cell module 1 may be a part of the roof 71 itself as shown in FIG. 4A. Specifically, the solar cell module 1 shown in FIG. 4A is a sunroof. Further, the vehicle 7 shown in FIG. 4A has a large curvature of the roof 71 with respect to the vehicle width direction (the left-right direction in FIG. 4A) as compared with the vehicle length direction (the up-down direction in FIG. 4A). In accordance with this, the solar cell module 1 is mounted as a part of the roof 71 so that the roof 71 has a shape having a larger curvature with respect to the vehicle width direction. That is, the reinforcing portion 42a for suppressing deformation of the film base material 42 is disposed along the vehicle-width direction when the solar cell module 1 is mounted as a part of the roof 71. In addition, the first cells 40 are arranged at regular intervals S. Neither the first nor the second solar cell units 4, 5 are arranged in the space constituting the interval S. Therefore, as shown in FIG. 4B, sunlight from the outside can be introduced into the inside of the vehicle 7 via the front surface layer 2, the interval S, and the back surface layer 3.

Figure 5A:
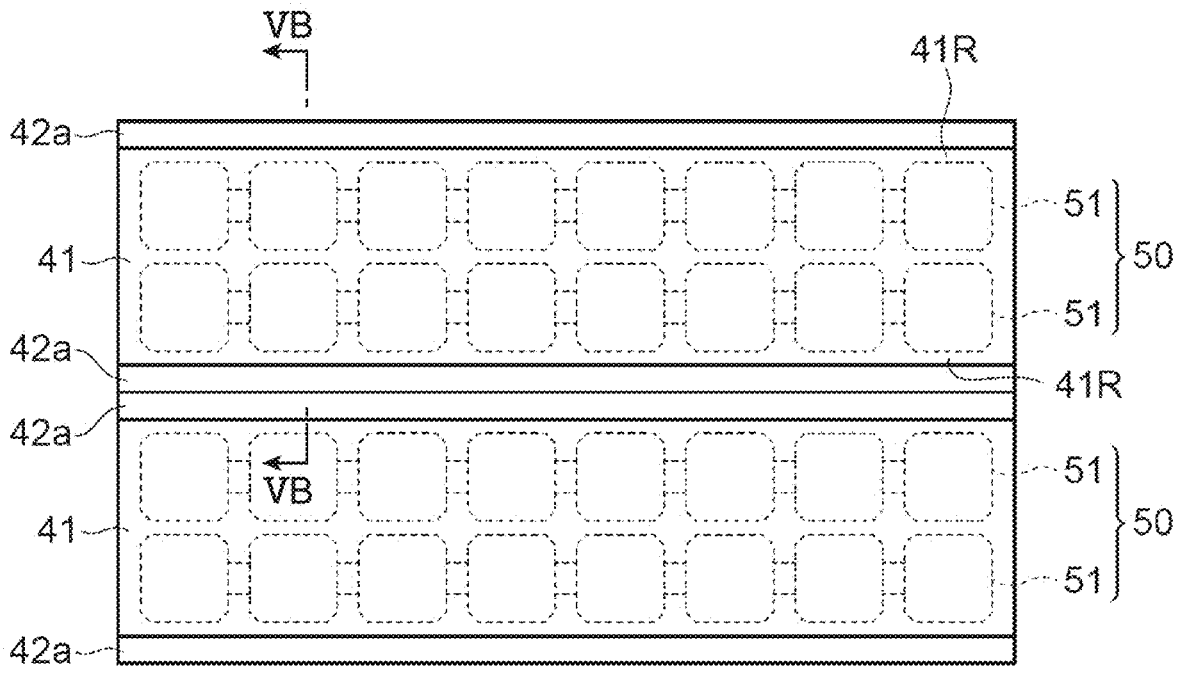
FIG. 5A is a plan view schematically showing a solar cell module according to a modification in which a plurality of silicon crystal elements arranged next to each other in two rows is included in one second cell.
Figure 5B:
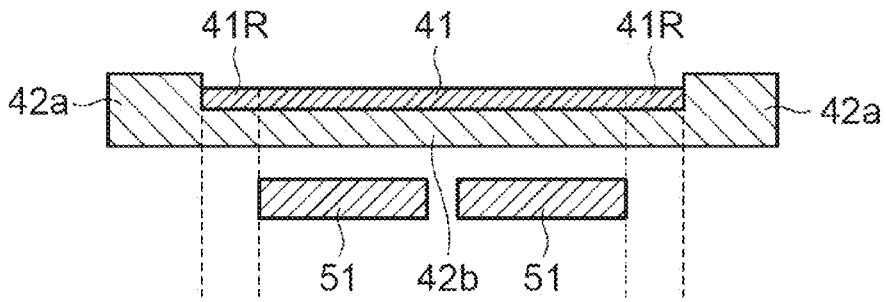
FIG. 5B is a sectional view taken along line VB-VB in FIG. 5A.

In addition, as a different embodiment from the above embodiment, FIG. 5A schematically shows the solar cell module 1 in which a plurality of silicon crystal elements 51 arranged next to each other in two rows are included in one second cell 50. FIG. 5B is a sectional view taken along line VB-VB in FIG. 5A. In one second cell 50, the entirety of the plurality of silicon crystal elements 51 are more closely arranged in two rows. Even in this case, the width of the second cell 50 in the lateral direction can be made shorter than the width of the perovskite element 41 in the same direction, and the power generation region 41R of the perovskite element 41 can be left. Here, the width of the second cell 50 in the lateral direction refers to the distance between the left end of the left silicon crystal element 51 and the right end of the right silicon crystal element 51 among the two silicon crystal elements 51 in the direction shown in FIG. 5B. Thus, even in a configuration in which the entirety of the plurality of silicon crystal elements 51 arranged next to each other in two rows is included in one second cell 50, even when the reinforcing portion 42a is irradiated with the illumination light from an oblique direction, the shaded part due to the reinforcing portion 42a is difficult to be reflected in the silicon crystal element 51. As a result, it is possible to suppress the occurrence of hot spots of the silicon crystal element 51 caused by the shadow portion appearing in the silicon crystal element 51.

What is claimed is:

1. A solar cell module in a form of a curved plate, the solar cell module characterized by comprising:

a light-transmitting front surface layer;

a back surface layer;

a first solar cell unit and a second solar cell unit that are arranged in an order of the first solar cell unit and the second solar cell unit from a front surface layer side between the front surface layer and the back surface layer; and a sealing material that seals the first solar cell unit and the second solar cell unit, wherein:

the first solar cell unit includes a plurality of strip-shaped first cells;

the first cells are arranged next to each other in a lateral direction of the first cell;

each of the first cells includes a flexible, strip-shaped film base material and a first power generation element, the first power generation element being disposed along a longitudinal direction of the film base material on one surface of the film base material, and the first cells being curved according to a curved shape of the solar cell module;

the second solar cell unit includes a plurality of second power generation elements arranged in the longitudinal direction of the film base material so as to face the other surface of each of the film base materials along a longitudinal direction of the first cell; and a reinforcing portion is provided at an edge portion of the film base material, the edge portion being a portion along the longitudinal direction of the film base material, and the reinforcing portion having a higher bending rigidity than a remaining portion of the film base material.

2. The solar cell module according to claim 1, wherein:
the first power generation element is longer than the second power generation element in a lateral direction of the film base material; and
the second power generation element is disposed with respect to the first power generation element in the lateral direction so as to leave a power generation region of the first power generation element on both sides in the lateral direction, when the solar cell module is viewed in a thickness direction.

3. The solar cell module according to claim 1, wherein:
the solar cell module is curved along a first direction, and is more curved along a second direction perpendicular to the first direction than along the first direction; and
the first cells are arranged in such a manner that the longitudinal direction coincides with the second direction.

4. A vehicle equipped with the solar cell module according to claim 3, as at least part of a roof.

5. A method for manufacturing a solar cell module in a form of a curved plate,
the solar cell module including a first solar cell unit and a second solar cell unit,
the first solar cell unit including a plurality of strip-shaped first cells,
each of the first cells including a flexible, strip-shaped film base material and a first power generation element, the first power generation element being disposed along a longitudinal direction of the film base material on one surface of the film base material, and
the second solar cell unit including a plurality of second power generation elements,
the method comprising:
fabricating a stack in which the first solar cell unit and the second solar cell unit are arranged between a light-transmitting curved front panel and a curved back panel so as to sandwich a sealing sheet between the front panel and the back panel, the first solar cell unit and the second solar cell unit being arranged in an order of the first solar cell unit and the second solar cell unit from a front panel side, and the sealing sheet being made of a resin; and
pressing the stack by hot press at a heating temperature equal to or higher than a softening point of the resin until the first solar cell unit and the second solar cell unit are sealed with the resin of the sealing sheet, wherein
in the fabricating,
the first cells, each having a reinforcing portion formed at an edge portion of the film base material, are arranged next to each other in a lateral direction of the first cell, the edge portion being a portion along the longitudinal direction of the film base material, and the reinforcing portion having a higher bending rigidity than a remaining portion of the film base material, and
the second power generation elements are arranged in the longitudinal direction of the film base material so as to face the other surface of each of the film base materials along a longitudinal direction of the first cell.

* * * * *